United States Patent
Zhang (10) Patent No.: US 8,785,264 B2
(45) Date of Patent: Jul. 22, 2014

(54) ORGANIC TFT ARRAY SUBSTRATE AND MANUFACTURE METHOD THEREOF

(75) Inventor: Xuehui Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 153 days.

(21) Appl. No.: 13/479,048

(22) Filed: May 23, 2012

(65) Prior Publication Data

US 2012/0298972 A1 Nov. 29, 2012

(30) Foreign Application Priority Data

May 24, 2011 (CN) .......................... 2011 1 0136011

(51) Int. Cl.
*H01L 21/84* (2006.01)
(52) U.S. Cl.
USPC ............... 438/161; 257/82; 257/99; 257/149; 257/151; 257/E29.151
(58) Field of Classification Search
USPC ............... 438/48, 82, 99, 128, 129, 149, 151, 438/161; 257/40, 43, 49, 52, 59, 72, 257/E27.131, E29.151
See application file for complete search history.

(56) References Cited

U.S. PATENT DOCUMENTS

| 8,629,434 B2 * | 1/2014 | Arai ................................. 257/43 |
| 2006/0284172 A1 * | 12/2006 | Ishii ................................. 257/43 |
| 2007/0120116 A1 | 5/2007 | Han |
| 2009/0026445 A1 | 1/2009 | Noh et al. |
| 2009/0096949 A1 | 4/2009 | Cho et al. |
| 2013/0264575 A1 * | 10/2013 | Liu ................................. 257/59 |

FOREIGN PATENT DOCUMENTS

KR 20090065645 A 6/2009

OTHER PUBLICATIONS

Extended European Search Report dated Aug. 20, 2012; Appln. No. 12169196.8-1235.
KIPO Office Action dated Aug. 29, 2013; Appln. No. 10-2012-0055575.

* cited by examiner

*Primary Examiner* — Eduardo A Rodela
(74) *Attorney, Agent, or Firm* — Ladas & Parry LLP (57) ABSTRACT

According to an embodiment of the disclosed technology, a manufacture method of an organic thin film transistor array substrate is provided. The method comprises: forming a first pixel electrode, a source electrode, a drain electrode and a data line in a first patterning process; forming an organic semiconductor island and a gate insulating island in a second patterning process; forming a data pad region in a third patterning process; and forming a second pixel electrode, a gate electrode and a gate line in a fourth patterning process.

10 Claims, 7 Drawing Sheets

ORGANIC TFT ARRAY SUBSTRATE AND MANUFACTURE METHOD THEREOF

CROSS REFERENCE TO RELATED APPLICATIONS

This application claims the benefit of Chinese Patent Application No. 201110136011.9 filed May 24, 2011, the entire disclosure of which is incorporated herein by reference.

BACKGROUND

One or more embodiments of the disclosed technology relate to an organic thin film transistor array substrate and a method of manufacturing the same.

Organic thin film transistors (OTFTs) are a kind of thin film transistors with an active layer made of an organic semiconductor material. Compared with the inorganic thin film transistor, the OTFTs have the following advantages. More methods, such as a Langmuir-Blodgett (LB) method, a molecular self-assembly method, a vacuum evaporation method, an ink-jetting print method and the like, can be used to prepare an organic thin film, thus the manufacture processes can be simplified and diversified and the manufacture cost can be reduced. The devices can be made in a smaller size, thus the integration level can be increased, and in turn the operation power can be decreased and the operation speed can be increased. In addition, in the case where the active layer is made of an organic semiconductor material, the electrical properties of the active layer can become desirable by modifying the structure of the organic molecules. The organic materials may be obtained in an economic way and sometimes the manufacture process of the organic field effect transistors (FETs) do not need strict control on the atmosphere conditions and the purities, thus the manufacture cost can be decreased. In addition, the transistor totally made of the organic materials has excellent flexibility and light weight. In addition, it is reported that the electrical properties of the device is not significantly affected when the device is appropriately twisted or curved. Such excellent flexibility further expands the applications of the organic transistor, for example, the organic transistor can be used in the fields of flat displays, sensors, memories, RF IDs and the like. Based on the above advantages, the research and development on the organic thin film transistors are widely performed.

Some manufacture processes have been developed to fabricate the organic thin film transistor array substrate; however each of these processes needs 6-7 patterning processes. During each patterning process, a mask is employed to obtain the film pattern (for example, circuit pattern) by applying photoresist, exposing, developing, and etching, and the mask is needed to precisely provided on the film patterns which have been previously prepared. Therefore, these manufacture processes need a number of masks and are complicated, and the manufacture efficiency is low and the manufacture cost is high.

SUMMARY

According to an embodiment of the disclosed technology, a manufacture method of an organic thin film transistor array substrate is provided. The method comprises: sequentially forming a first transparent conductive film and a source-drain metal film on a base substrate and then performing a first patterning process to form a first pixel electrode, a source electrode, a drain electrode and a data line; sequentially forming an organic semiconductor film and a gate insulating film and then performing a second patterning process to form an island of the organic semiconductor film and an island of the gate insulating film, wherein both the organic semiconductor island and the gate insulating island are provided above the source electrode and the drain electrode; forming a passivation layer and then performing a third patterning process to form a data pad region; and sequentially forming a second transparent conductive film and a gate metal film and then performing a fourth patterning process to form a second pixel electrode, a gate electrode and a gate line.

According to another embodiment of the disclosed technology, an organic thin film transistor array substrate is provided. The array substrate comprises: a first pixel electrode, a source electrode, a drain electrode and a data line formed in a first patterning process; an organic semiconductor island and a gate insulating island formed in a second patterning process; a data pad region formed in a third patterning process; and a second pixel electrode, a gate electrode and a gate line formed in a fourth patterning process.

With the organic thin film transistor array substrate and the manufacture method thereof according to the embodiments of the disclosed technology, the manufacture process can be simplified and the number of the masks can be decreased, and thus the manufacture cost can be decreased and the production efficiency can be increased.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Hereinafter, the disclosed technology will be described in detail with reference to the embodiments and the accompanying drawings.

Figure 1:
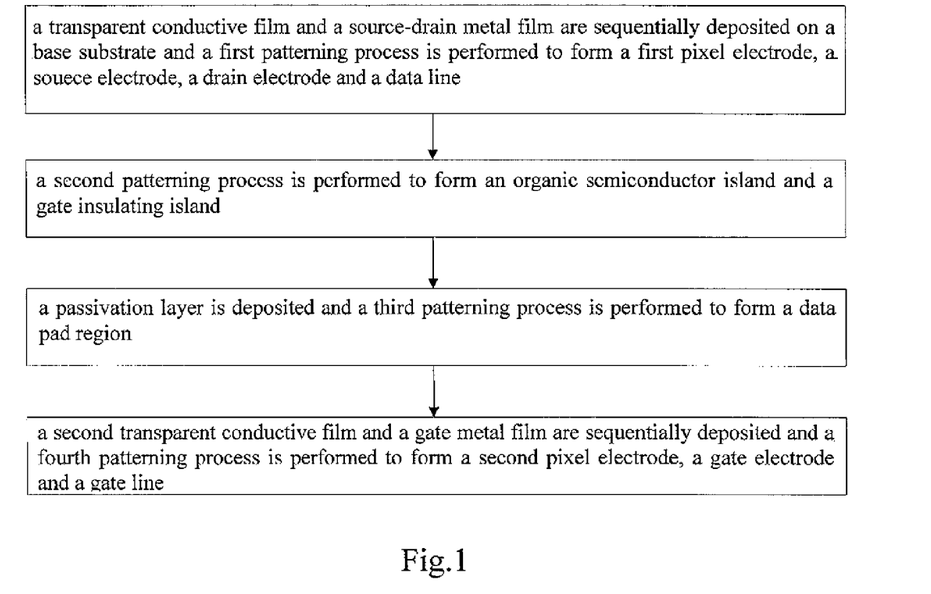
FIG. 1 is a flow chart showing a manufacture method of an organic thin film transistor array substrate according to the embodiment of the disclosed technology.

According to an embodiment of the disclosed technology, a manufacture method of an organic thin film transistor (OTFT) array substrate is provided. FIG. 1 is a flow chart showing the manufacture method of the organic thin film transistor array substrate according to the embodiment of the disclosed technology. As shown in FIG. 1, the method according to the embodiment comprises the following steps.

Step 101, a transparent conductive film and a source-drain metal film are sequentially deposited on a base substrate and a first patterning process is performed to form a first pixel electrode, a source electrode, a drain electrode and a data line.

Figure 2A:
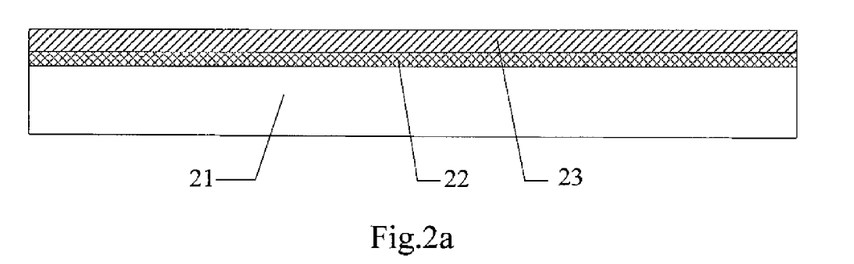
FIG. 2a is a sectional view showing the OTFT after a transparent conductive film and a metal film are deposited on a glass substrate according to the embodiment of the disclosed technology.

FIG. 2a is a sectional view showing the OTFT after the first transparent conductive film and the metal film are sequentially deposited on the base substrate according to the embodiment of the disclosed technology. The base substrate may be a glass substrate, a quartz substrate, a plastic substrate or the like. For example, a glass substrate is used in this embodiment. As shown in FIG. 2a, a first transparent conductive film 22 is firstly deposited and then a source-drain metal film 23 is deposited on the transparent conductive film 22. In this embodiment, the deposition may be performed by a sputtering method. The first transparent conductive film 22 may be made of indium tin oxide (ITO), indium zinc oxide (IZO) or any of other transparent conductive materials. The source-drain metal film may be made of aluminum, aluminum alloy, copper, copper alloy or any of other conductive metal materials.

Figure 2B:
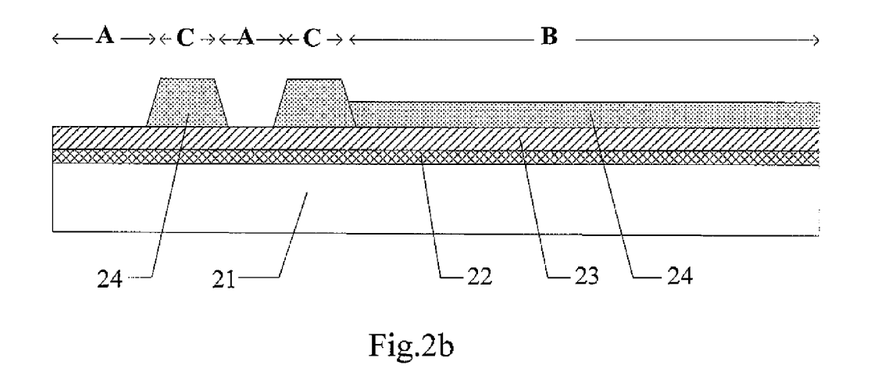
FIG. 2b is a sectional view showing the OTFT after exposing and developing processes in a first pattering process according to the embodiment of the disclosed technology.

FIG. 2b is a sectional view showing the OTFT after exposing and developing processes in a first patterning process according to the embodiment of the disclosed technology. A photoresist layer 24 is applied on the source-drain metal film 23 as shown in FIG. 2a for example by a spin coating method, the photoresist layer 24 is exposed with a half-tone or gray-tone mask, and then a developing process is performed to obtain a photoresist pattern shown in FIG. 2b. The photoresist pattern will be used as an etching mask for the following etching process. The photoresist pattern comprises regions A, regions B and regions C. The regions A belong to a photoresist-completely-removed region in which the photoresist is completely removed in the developing process. The regions B belong to a photoresist-partially-remained region in which the photoresist is partially removed in the developing process. The regions C belong to a photoresist-completely-remained region in which the photoresist is remained in the developing process. In this embodiment, the photoresist may be of positive type or negative type. In the first patterning process according to this embodiment, the photoresist-completely-remained region corresponds to the region for forming the source electrode, the drain electrode and the data line, the photoresist-partially-remained region corresponds to the first pixel electrode, and the photoresist-completely-removed region corresponds to other regions than the photoresist-completely-remained region and the photoresist-partially-remained region and comprises the region for forming the channel of the thin film transistor.

Figure 2C:
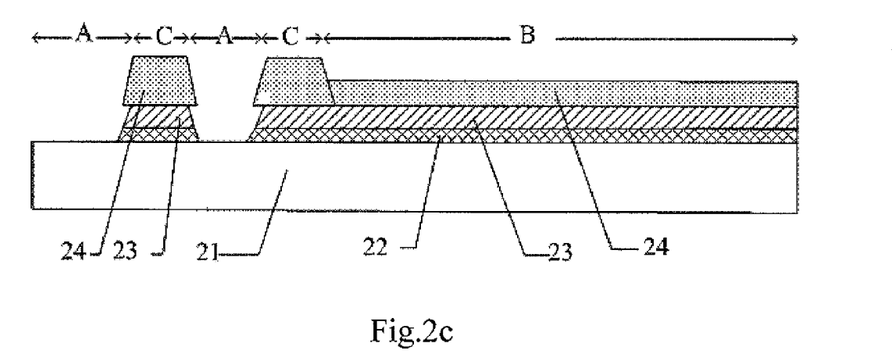
FIG. 2c is a sectional view showing the OTFT after a first etching process in the first patterning process according to the embodiment of the disclosed technology.

FIG. 2c is a sectional view showing the OTFT after a first etching process in the first patterning process according to the embodiment of the disclosed technology. As shown in FIG. 2c, the transparent conductive film 22 and the source-drain metal film 23 on the glass substrate are processed in the first etching process by using the photoresist pattern of FIG. 2b as the etching mask. The transparent conductive film 22 and the source-drain metal film 23 in the photoresist-completely-removed region are etched away.

Figure 2D:
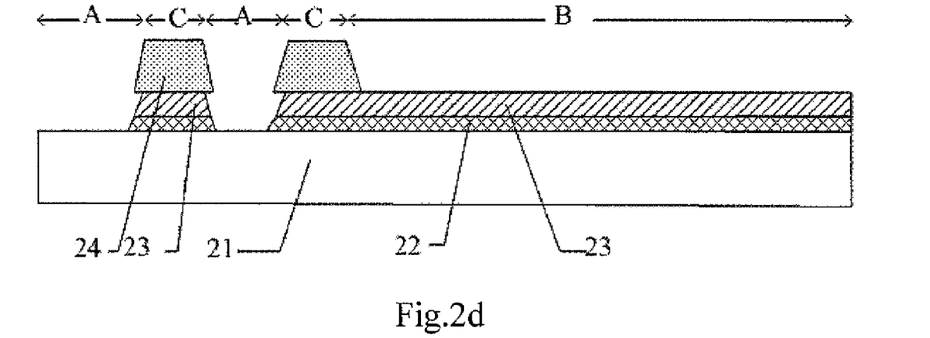
FIG. 2d is a sectional view showing the OTFT after an ashing process in the first patterning process according to the embodiment of the disclosed technology.

FIG. 2d is a sectional view showing the OTFT after an ashing process in the first patterning process according to the embodiment of the disclosed technology. As shown in FIG. 2d, the photoresist pattern shown in FIG. 2c is ashed so that the photoresist in the photoresist-partially-remained region is removed and the thickness of the photoresist in the photoresist-completely-remained region is decreased accordingly.

Figure 2E:
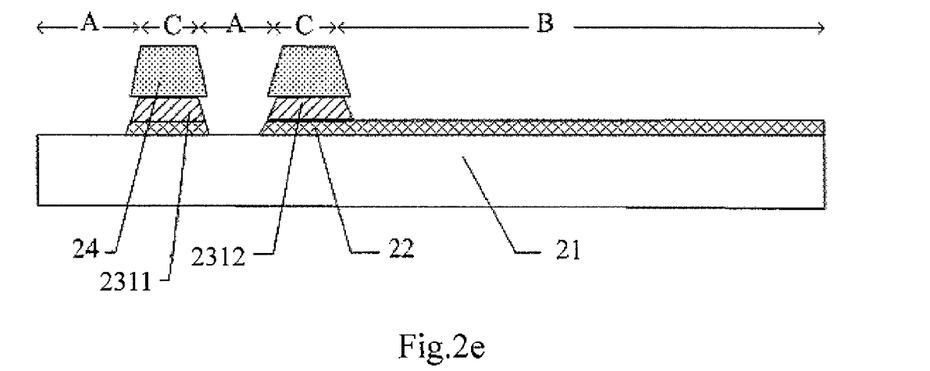
FIG. 2e is a sectional view showing the OTFT after a second etching process in the first patterning process according to the embodiment of the disclosed technology.

FIG. 2e is a sectional view showing the OTFT after a second etching process in the first patterning process according to the embodiment of the disclosed technology. As shown in FIG. 2e, the transparent conductive film 22 and the source-drain metal film 23 on the glass substrate are processed in the second etching process by using the photoresist pattern in FIG. 2d as the etching mask. As shown in FIG. 2e, the source-drain metal film in the photoresist-partially-remained region is etched away to obtain the first pixel electrode 2210.

Figure 2F:
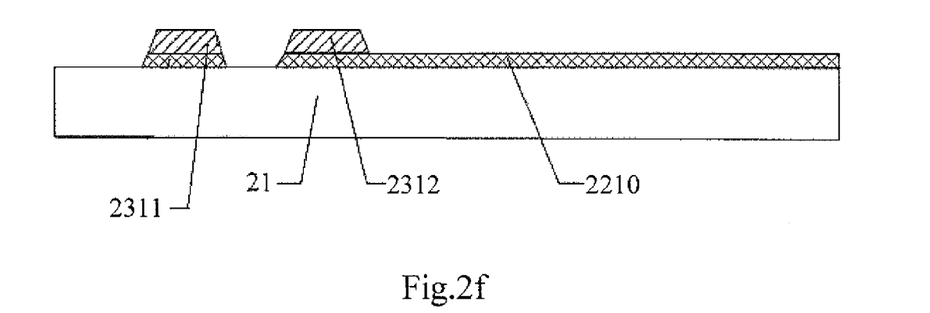
FIG. 2f is a sectional view showing the OTFT after the photoresist is removed in the first patterning process according to the embodiment of the disclosed technology.
Figure 2G:
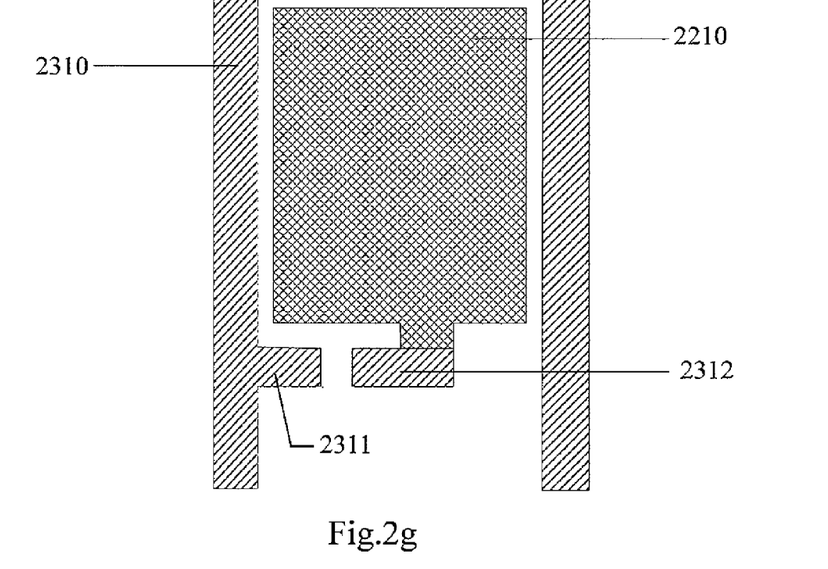
FIG. 2g is a plan view showing the OTFT after the second etching process in the first patterning process according to the embodiment of the disclosed technology.

FIG. 2g is a plan view showing the OTFT after the second etching process in the first patterning process according to the embodiment of the disclosed technology, and FIG. 2f is a sectional view showing the OTFT after the photoresist is removed in the first patterning process according to the embodiment of the disclosed technology. As shown in FIG. 2f and FIG. 2g, the photoresist in the photoresist-completely-remained region is removed to obtain the source electrode 2311, the drain electrode 2312, the data line 2310 and the first pixel electrode 2210. The source electrode 2311 and the data line 2310 are connected with each other.

Step 102, a second patterning process is performed to form an organic semiconductor island and a gate insulating island.

Figure 3A:
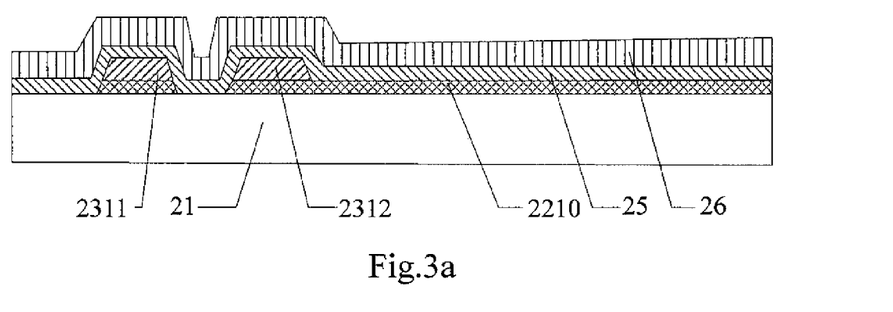
FIG. 3a is a sectional view showing the OTFT after an organic semiconductor film and a gate insulating film are prepared according to the embodiment of the disclosed technology.

FIG. 3a is a sectional view showing the OTFT after an organic semiconductor film and a gate insulating film are prepared according to the embodiment of the disclosed technology. As shown in FIG. 3a, an organic semiconductor film 25 is prepared on the glass substrate 21 after Step 101 for example by a vacuum evaporation method. For example, the thickness of the organic semiconductor film 25 is 50 nm. For example, the organic semiconductor film 25 may be made of vanadium oxide phthalocyanine. Then, a gate insulating film 26 is prepared for example by a spin coating method. The gate insulating film 26 may be made of an organic insulating material such as PVP (poly (4-vinylphenol)). In an example, the gate insulating film 26 of PVP is pre-baked for 20 minutes at 100 and then is after-baked for 20 minutes at 130. For example, the thickness of the obtained gate insulating film is 550 nm.

Other examples of the organic semiconductor film 25 comprise pentacene and polythiophene; and other exemplary organic insulating materials for the gate insulating film comprise polyimide, polyvinyl alcohol, and benzocyclobutene.

Figure 3B:
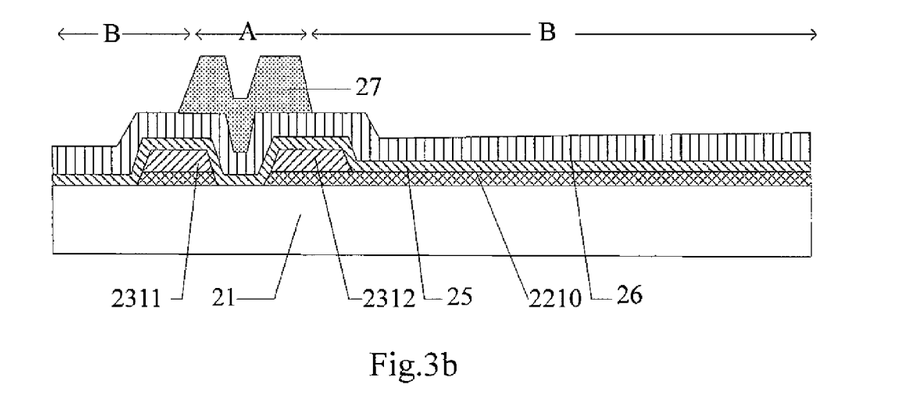
FIG. 3b is a sectional view showing the OTFT after exposing and developing processes in a second patterning process according to the embodiment of the disclosed technology.

FIG. 3b is a sectional view showing the OTFT after exposing and developing processes in a second patterning process according to the embodiment of the disclosed technology. A photoresist layer 27 is applied on the gate insulating film 26 on the glass substrate as shown FIG. 3a for example by a spin coating method. The photoresist layer 27 is exposed by a normal mask, and then a developing process is performed to obtain a photoresist pattern as shown in FIG. 3b. The photoresist pattern will be used as an etching mask for the following etching process. The photoresist pattern have regions A in which the photoresist is remained in the developing process and a region B in which the photoresist is removed in the developing process. In the second patterning process according to this embodiment, the photoresist-completely-remained region (i.e., region A) corresponds to the region for forming the organic semiconductor island and the gate insulating island.

Figure 3C:
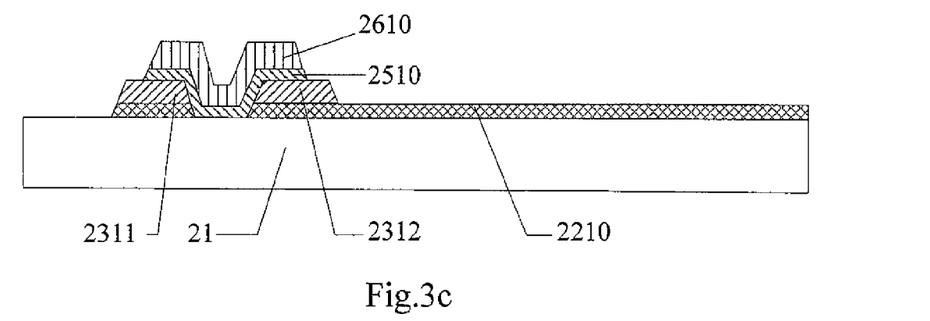
FIG. 3c is a sectional view showing the OTFT after an etching process in the second patterning process according to the embodiment of the disclosed technology.
Figure 3D:
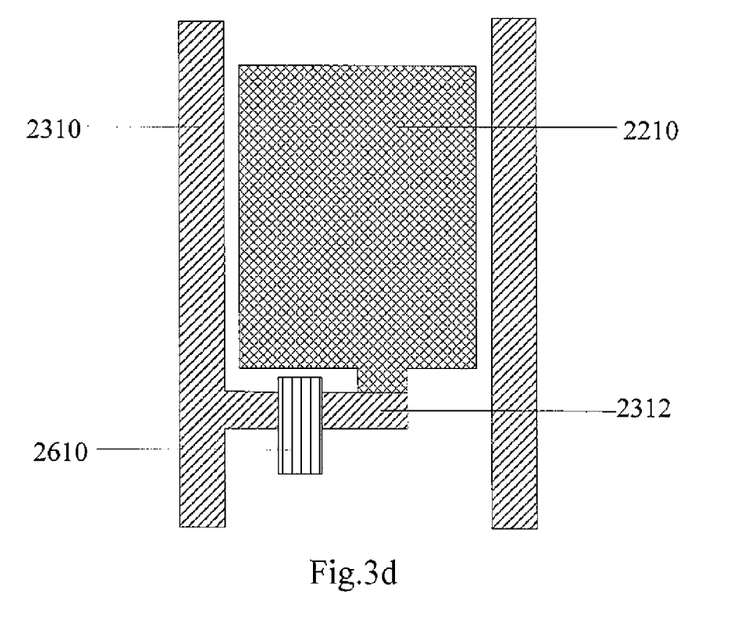
FIG. 3d is a plan view showing the OTFT after the etching process in the second patterning process according to the embodiment of the disclosed technology.

FIG. 3c is a sectional view showing the OTFT after an etching process in the second patterning process according to the embodiment of the disclosed technology, and FIG. 3d is a plan view showing the OTFT after the etching process in the second patterning process according to the embodiment of the disclosed technology. As shown in FIGS. 3c and 3d, the laminated layers of the organic semiconductor film and the gate insulating film in FIG. 3b are etched so that the gate insulating film and the organic semiconductor film in the photoresist-removed region are etched away. In this way, the gate insulating island 2510 and the semiconductor island 2510 are obtained, and the island 2610 is provided below the semiconductor island 2510.

In this step, the organic semiconductor film and the gate insulating film are prepared first, and this step is a basic step for manufacturing the organic thin film transistor array substrate.

Step 103, a passivation layer is deposited and a third patterning process is performed to form a data pad region.

Figure 4:
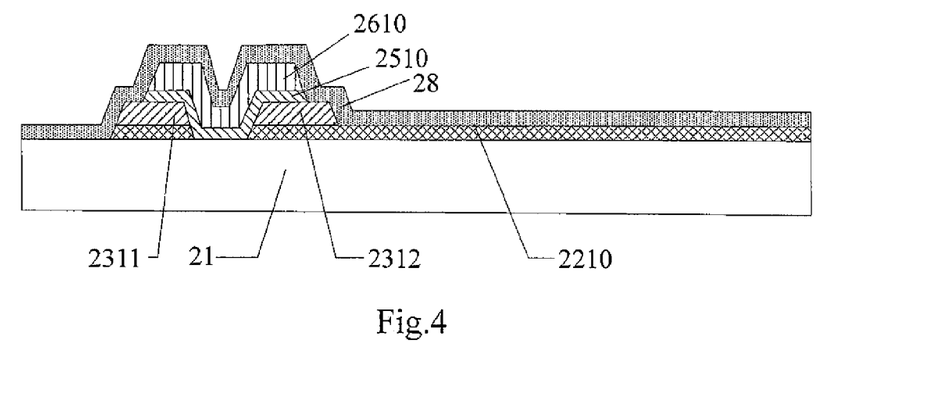
FIG. 4 is a sectional view showing the OTFT after a third patterning process according to the embodiment of the disclosed technology.

FIG. 4 is a sectional view showing the OTFT after the third patterning process according to the embodiment of the disclosed technology. As shown in FIG. 4, the passivation layer is prepared on the glass substrate after Step 102. Then, the third patterning process is performed so that the passivation layer in the data pad region is removed and the data line in this region is exposed. In this way, a passivation layer pattern 28 is formed and the data pad region (not shown) is obtained. The data pad region is provided at the edge of the array substrate to be formed and used to connect the data line to the external circuit such as the driver.

Step 104, a second transparent conductive film and a gate metal film are sequentially deposited and a fourth patterning process is performed to form a second pixel electrode, a gate electrode and a gate line.

Figure 5A:
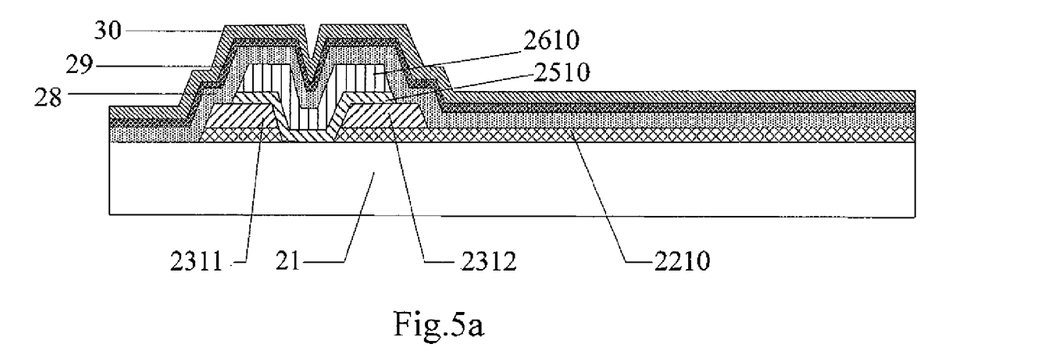
FIG. 5a is a sectional view showing that a transparent conductive film and a gate metal film are deposited on the array substrate after the third patterning process according to the embodiment of the disclosed technology.

FIG. 5a is a sectional view showing that the transparent conductive film and the gate metal film are deposited on the array substrate after the third patterning process according to the embodiment of the disclosed technology. As shown in FIG. 5a, the second transparent conductive film 29 is deposited on the glass substrate after Step 103 and then the gate metal film 30 is deposited. The second transparent conductive film 29 may be made of ITO, IZO or any of other transparent conductive materials. The gate metal film 30 may be Al, Al alloy, Cu, Cu alloy or any of other metal conductive materials.

Figure 5B:
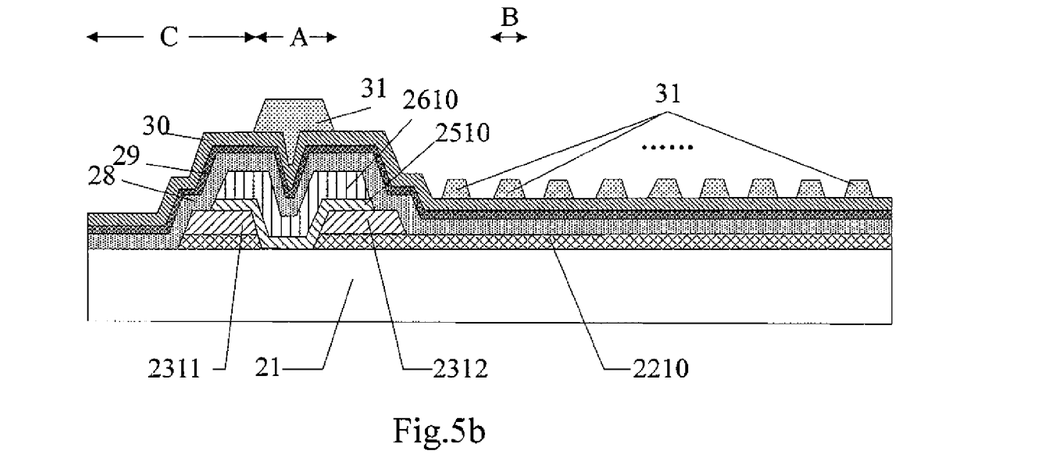
FIG. 5b is a sectional view showing the OTFT after exposing and developing processes in a fourth patterning process according to the embodiment of the disclosed technology.

FIG. 5b is a sectional view showing the OTFT after exposing and developing processes in a fourth patterning process according to the embodiment of the disclosed technology. After the second transparent conductive film 29 and the gate metal film 30 are deposited, a photoresist layer 31 is applied on the gate metal film 30 for example by a spin coating method. Then, the photoresist layer 31 is exposed by a half-tone or gray-tone mask and a developing process is performed to obtain a photoresist pattern as shown in FIG. 5b. This photoresist pattern will be used as an etching mask for the following etching process. The photoresist pattern comprises regions A, regions B and regions C. The regions A belong to a photoresist-completely-remained region in which the photoresist is remained in the developing process. The regions B belong to a photoresist-partially-remained region in which the photoresist is partially removed in the developing process. The regions C belong to a photoresist-completely-removed region in which the photoresist is removed in the developing process. In this patterning process, the photoresist-completely-remained region corresponds to the region for forming the gate electrode and the gate line, the photoresist-partially-remained region corresponds to the region for forming the second pixel electrode, and the photoresist-completely-removed region corresponds to other regions than the above two regions.

Figure 5C:
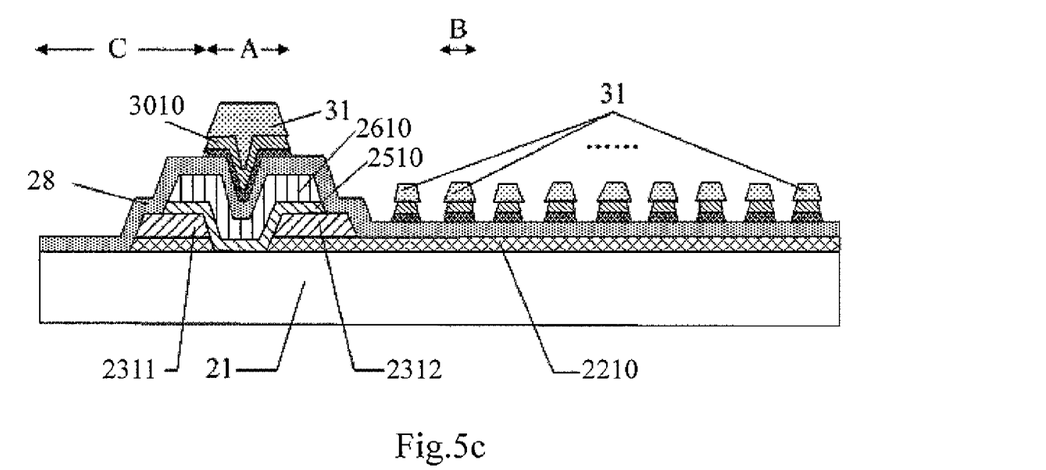
FIG. 5c is a sectional view showing the OTFT after a first etching process in the fourth patterning process according to the embodiment of the disclosed technology.

FIG. 5c is a sectional view showing the OTFT after a first etching process in the fourth patterning process according to the embodiment of the disclosed technology. As shown in FIG. 5c, the laminated layers of the transparent conductive film 29 and the gate metal film 30 are processed by using the photoresist pattern in FIG. 5b as the etching mask, so that the transparent conductive film 29 and the gate metal film 30 in the photoresist-completely-removed region are etched away. In this way, the second pixel electrode 2910 is obtained on the passsivation pattern 28. For example, the second pixel electrode 2910 may be a block electrode with silts, a comb-like electrode or the like.

Figure 5D:
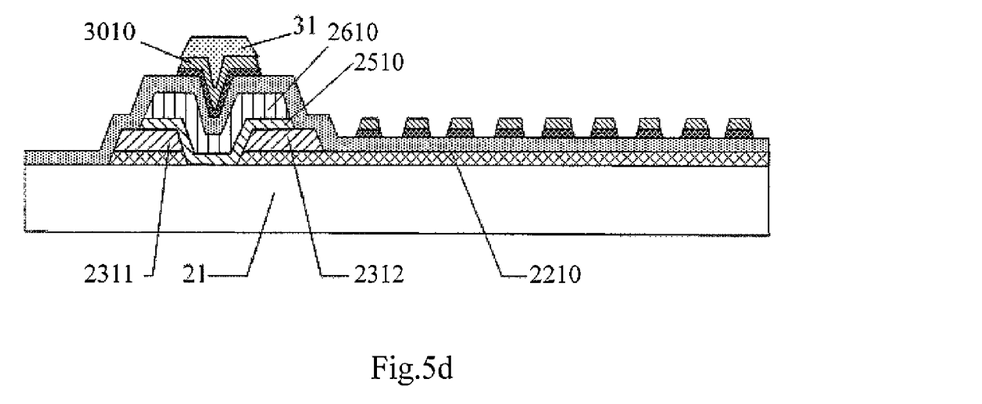
FIG. 5d is a sectional view showing the OTFT after an ashing process in the fourth patterning process according to the embodiment of the disclosed technology.

FIG. 5d is a sectional view showing the OTFT after an ashing process in the fourth patterning process according to the embodiment of the disclosed technology. As shown in FIG. 5c, the photoresist pattern as shown in FIG. 5c is ashed, so that the photoresist in the photoresist-partially-remained is removed and the thickness of the photoresist in the photoresist-completely-remained region is decreased.

Figure 5E:
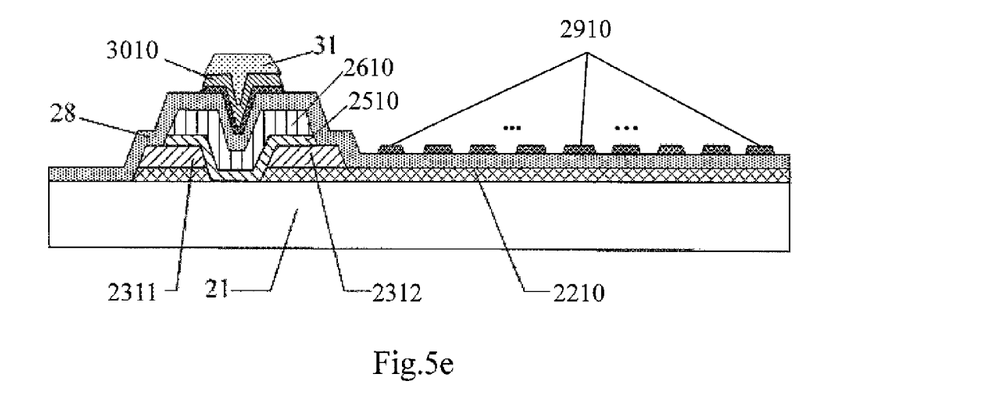
FIG. 5e is a sectional view showing the OTFT after a second etching process in the fourth patterning process according to the embodiment of the disclosed technology.

FIG. 5e is a sectional view showing the OTFT after a second etching process in the fourth patterning process according to the embodiment of the disclosed technology. As shown in FIG. 5e, the gate metal film 30 is processed in the second etching process by using the photoresist pattern obtained in FIG. 5d. In this way, the gate metal film provided on the second pixel electrode 2910 is etched away and the second pixel electrode 2910 is exposed.

Figure 5F:
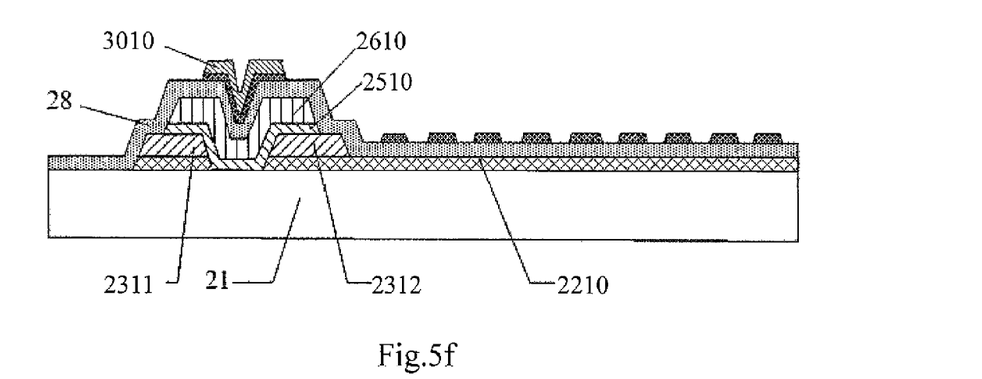
FIG. 5f is a sectional view showing the OTFT after the photoresist is removed in the fourth patterning process according to the embodiment of the disclosed technology.

FIG. 5f is a sectional view showing the OTFT after the photoresist is removed in the fourth patterning process according to the embodiment of the disclosed technology. As shown in FIG. 5f, the photoresist remained on the glass substrate 21 is removed to obtain the gate electrode 3010 and the gate line (not shown). A portion of the second transparent conductive film is remained below the gate electrode 3010. The gate electrode is provided above the island of the organic semiconductor film 2510 and is connected with the gate line.

By the above steps, the organic thin film transistor array substrate is obtained. This array substrate may be used for a liquid crystal display, in which the array substrate and a color filter substrate are assembled together to face each other and a liquid crystal layer is provided therebetween so that a liquid crystal panel is obtained. During the operation of the liquid crystal panel, in each pixel the first pixel electrode 2210 and the second pixel electrode 2910 are charged when the organic thin film transistor is turned on, and thus an electrical field is formed between the first pixel electrode 2210 and the second pixel electrode 2910 to control the orientation of the liquid crystal molecules in the liquid crystal layer.

According to another embodiment of the disclosed technology, an organic thin film transistor array substrate is provided. As shown in FIG. 5f, the organic thin film transistor array substrate comprises a plurality of pixels and each pixel comprises a thin film transistor. Further, each pixel comprises: a base substrate 21; a first pixel electrode 2210, a source electrode 2311, a drain electrode 2312 and a data line 2310 which are formed for example in the first patterning process; an organic semiconductor island 2510 and a gate insulating island 2610 which are formed for example in the second patterning process; a passivation layer and a data pad region which is formed for example in the third patterning process; a second pixel electrode 2910, a gate electrode 3010 and a gate line which are formed for example in the fourth patterning process. The gate electrode 3010 is provided above the organic semiconductor island 2510. The source electrode 2311, the drain electrode 2312, the organic semiconductor island 2510, the gate insulating island 2610 and the gate electrode 3010 compose the thin film transistor. The thin film transistor is controlled by the signal transmitted over the gate line so that the thin film transistor can be turned on or off. When the thin film transistor is turned on, the voltage signal of the data line is transmitted to the first pixel electrode 2210.

According to an embodiment of the disclosed technology, the organic thin film transistor array substrate can be obtained by four patterning processes, that is, the manufacture method of the organic thin film transistor array substrate comprises four patterning processes. The first pixel electrode, the source electrode, the drain electrode and the data line can be formed in a same patterning process, the organic semiconductor island and the gate insulating island can be formed in a same patterning process, and the second pixel electrode, the gate electrode and the gate line can be formed in a same patterning process. Therefore, according to the embodiments of the disclosed technology, the manufacture process of the organic thin film transistor array substrate can be simplified and the number of the masks can be decreased, and thus the manufacture cost can be decreased and the efficiency can be increased.

It should be appreciated that the embodiments described above are intended to illustrate but not limit the disclosed technology. Although the disclosed technology has been described in detail herein with reference to the preferred embodiments, it should be understood by those skilled in the art that the disclosed technology can be modified and some of the technical features can be equivalently substituted without departing from the spirit and scope of the disclosed technology.

What is claimed is:

1. A manufacture method of an organic thin film transistor array substrate comprising:
    sequentially forming a first transparent conductive film and a source-drain metal film on a base substrate and then performing a first patterning process to form a first pixel electrode, a source electrode, a drain electrode and a data line;
    sequentially forming an organic semiconductor film and a gate insulating film and then performing a second patterning process to form an organic semiconductor island and a gate insulating island, wherein both the organic semiconductor island and the gate insulating island are provided above the source electrode and the drain electrode;
    forming a passivation layer and then performing a third patterning process to form a data pad region; and
    sequentially forming a second transparent conductive film and a gate metal film and then performing a fourth patterning process to form a second pixel electrode, a gate electrode and a gate line.

2. The method according to claim 1, wherein the first patterning process comprises:
    applying a photoresist layer on the source-drain metal film, performing exposing and developing processes on the photoresist layer by using a mask to obtain a photoresist-completely-removed region, a photoresist-partially-remained region and a photoresist-completely-remained region;
    performing a first etching process to etch the first transparent conductive film and the source-drain metal film in the photoresist-completely-removed region;
    performing an ashing process on the photoresist layer so that the photoresist in the photoresist-partially-remained region is removed and the thickness of the photoresist in the photoresist-completely-remained region is decreased;
    performing a second etching process to etch the source-drain metal film in the photoresist-partially-remained region and obtain the first pixel electrode; and
    removing the photoresist in the photoresist-completely-remained region to obtain the source electrode, the drain electrode and the data line.

3. The method according to claim 2, wherein the mask used in the first patterning process is a half-tone mask or a gray-tone mask.

4. The method according to claim 1, wherein the second patterning process comprises:
    forming the organic semiconductor film and the gate insulating film and performing a pre-baking process and an after-baking process;
    applying a photoresist layer, and performing exposing and developing processes on the photoresist layer by using a mask to obtain a photoresist-remained region and a photoresist-removed region; and
    performing an etching process to etch the gate insulating film and the organic semiconductor film in the photoresist-removed region.

5. The method according to claim 4, wherein
    the pre-baking process is performed for 20 minutes at 100° C.;
    and the after-baking process is performed for 20 minutes at 130° C.

6. The method according to claim 4, wherein the organic semiconductor film is made of vanadium oxide phthalocyanine, pentacene, or polythiophene.

7. The method according to claim 4, wherein the gate insulating film is made of poly (4-vinylphenol), polyimide, polyvinyl alcohol, or benzocyclobutene.

8. The method according to claim 1, wherein the third patterning process comprises:

performing the third patterning process to remove the passivation layer in the data pad region and expose the data line in this region, so that the data pad region is obtained.

9. The method according to claim 1, wherein the fourth patterning process comprises:

after sequentially forming the second transparent conductive film and the gate metal film, applying a photoresist layer on the gate metal film, and then performing exposing and developing processes on the photoresist layer by using a mask to obtain a photoresist-completely-removed region, a photoresist-partially-remained region and a photoresist-completely-remained region;

performing a first etching process to etch the second transparent conductive film and the gate metal film in the photoresist-completely-removed region;

performing an ashing process on the photoresist layer so that the photoresist in the photoresist-partially-remained region is removed and the thickness of the photoresist in the photoresist-completely-remained region is decreased;

performing a second etching process to obtain the second pixel electrode; and removing the photoresist in the photoresist-completely-remained region to obtain the gate electrode and the gate line.

10. The method according to claim 9, wherein the mask used in the fourth patterning process is a half-tone mask or a gray-tone mask.

* * * * *